United States Patent [19]

Nagano

[11] Patent Number: 4,524,292
[45] Date of Patent: Jun. 18, 1985

[54] ANALOG ARITHMETIC OPERATION CIRCUIT

[75] Inventor: Katsumi Nagano, Shimonoseki, Japan

[73] Assignee: Tokyo Shibaura Denki Kabushiki Kaisha, Japan

[21] Appl. No.: 414,945

[22] Filed: Sep. 3, 1982

[30] Foreign Application Priority Data

Sep. 24, 1981 [JP] Japan .................... 56-151274
Oct. 30, 1981 [JP] Japan .................... 56-173787

[51] Int. Cl.$^3$ .................... H03F 3/45; H03F 3/04
[52] U.S. Cl. .................... 307/494; 307/490; 307/498; 328/144; 328/160; 328/161; 330/252; 330/257
[58] Field of Search .................... 307/490–494, 307/498, 503; 328/142–145, 158, 160, 161; 330/207 R, 257, 252

[56] References Cited

U.S. PATENT DOCUMENTS

| | | | |
|---|---|---|---|
| 3,805,092 | 4/1974 | Henson | 307/498 |
| 3,838,262 | 9/1974 | van de Plassche | 307/498 X |
| 3,906,246 | 9/1975 | Okada | 307/498 X |
| 3,935,478 | 1/1976 | Okada et al. | 307/491 |
| 3,967,105 | 6/1976 | Harrington | 307/492 X |
| 4,323,797 | 4/1982 | Embree et al. | 307/490 |
| 4,338,527 | 7/1982 | Nagano | 307/494 |

OTHER PUBLICATIONS

Barker, "Translinear Frequency Doubler", 44, Int'l J. Electronics, 461–464, (1978).

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

An analog arithmetic operation circuit with small operation errors. An analog arithmetic operation circuit comprises: a first transistor; a second transistor, a base of which is connected to a first terminal of an emitter-collector path of the first transistor and a first terminal of an emitter-collector path of which is connected to a first power source; a third transistor, a base of which is connected to the base of the first transistor; a fourth transistor, a base of which is connected to a first terminal of an emitter-collector path of the third transistor and a first terminal of an emitter-collector path of which is connected to the first power source; and a circuit for supplying a given current which is the same as a predetermined input current to a second terminal of the emitter-collector path of one of the third and fourth transistors.

9 Claims, 15 Drawing Figures

F I G. 1
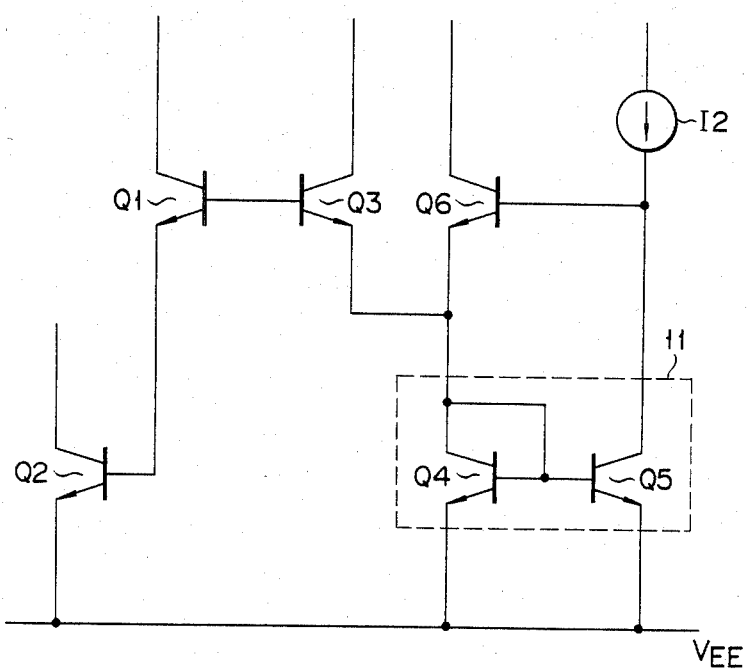
F I G. 2
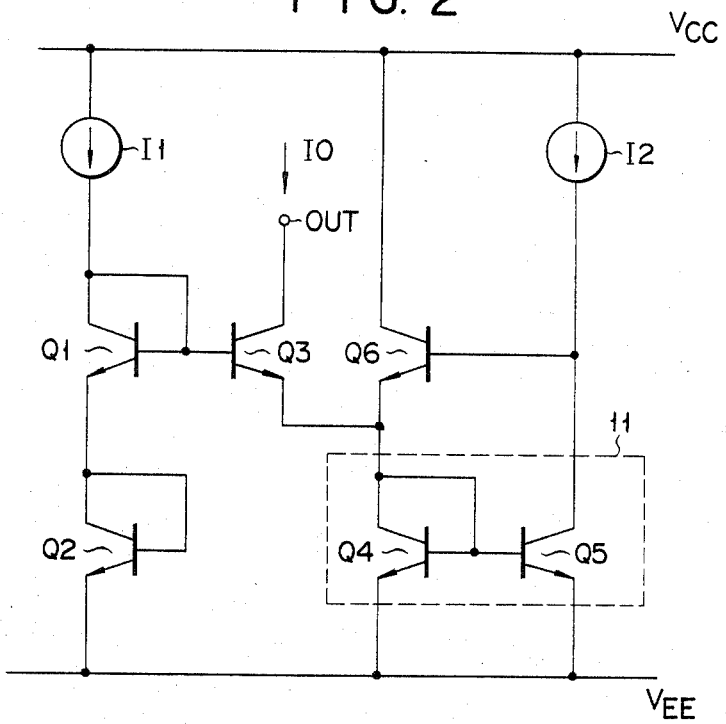

F I G. 14
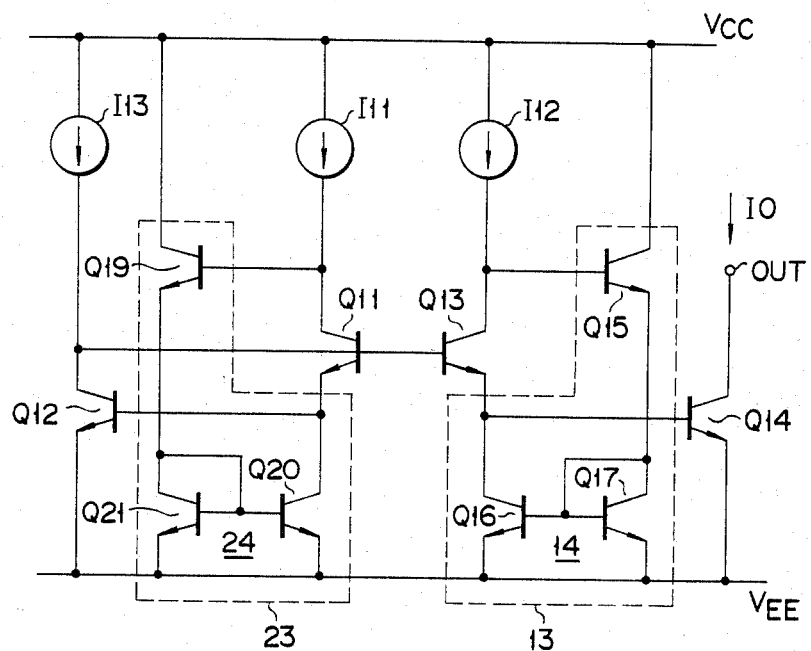
F I G. 15
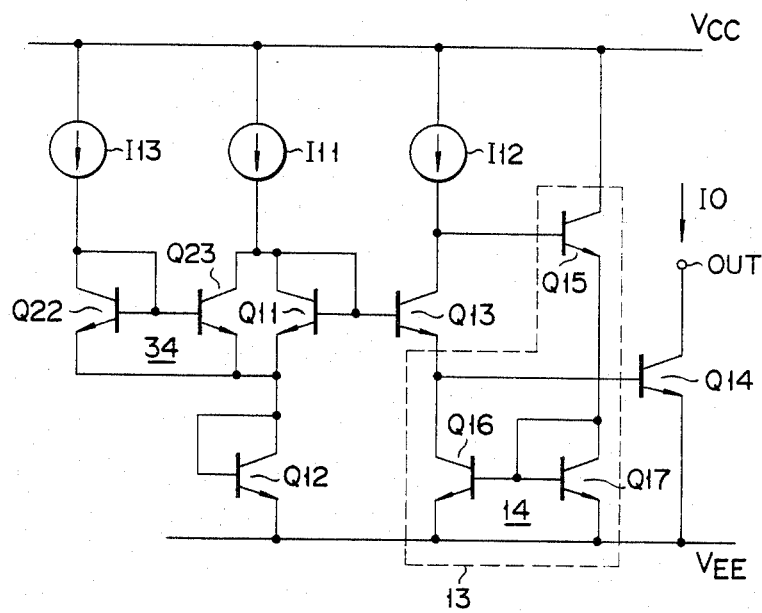

4,524,292

ANALOG ARITHMETIC OPERATION CIRCUIT

BACKGROUND OF THE INVENTION

The present invention relates to an analog arithmetic operation circuit for performing arithmetic operations such as squaring and square root operations.

An analog arithmetic operation circuit for performing squaring operation with a bipolar IC is described in *Int. J. Electronics,* PP. 461–464, No. 5, Vol. 44, 1982, by R. W. J. Barker. The relationship among an input current I1, a bias current I2 flowing in the arithmetic operation circuit and an output current I0 therefrom are given by the following equation:

$$I0(I0+I2)=I1^2 \quad (1)$$

If $I0 < < I2$, then the output current I0 is $I1^2/I2$ according to equation (1). Squaring operation is thus performed.

However, if the output current I0 and the bias current I2 do not satisfy the condition $I0 < < I2$, relation $I0=I1$ is given by equation (1) and squaring operation cannot be performed. For performing squaring operation with the above circuit, the range of the input currents is limited.

SUMMARY OF THE INVENTION

It is, therefore, an object of the present invention to provide an analog arithmetic operation circuit for performing arithmetic operations with a small error.

In order to achieve the above object of the present invention, there is provided an analog arithmetic operation circuit which comprises:

a first transistor;

a second transistor, a base of which is connected to a first terminal of an emitter-collector path of said first transistor and a first terminal of an emitter-collector path of which is connected to a first power source;

a third transistor, a base of which is connected to the base of said first transistor;

a fourth transistor, a base of which is connected to a first terminal of an emitter-collector path of said third transistor and a first terminal of an emitter-collector path of which is connected to said first power source; and a circuit for supplying a given current which is the same as a predetermined input current to a second terminal of the emitter-collector path of one of said third and fourth transistors.

In the analog arithmetic operation circuit with the above arrangement, since the given current which is the same as the predetermined input current is supplied to the second terminal of the emitter-collector path of one of the third and fourth transistor, an arithmetic error does not occur. Therefore, highly accurate analog arithmetic operation can be performed.

Further, various arithmetic operations such as squaring operation, square root operation, product-quotient operation and difference of squared values operation can be performed by connecting an open terminal of the emitter-collector path of the first to fourth transistors to various input current sources or the output terminal.

BRIEF DESCRIPTION OF THE DRAWINGS

Other objects and advantages will be apparent from the following description when taken in conjunction with the accompanying drawings in which:

FIG. 1 is a circuit diagram of a fundamental analog arithmetic operation circuit according to a first embodiment of the present invention;

FIG. 2 is a circuit diagram of a squaring circuit to which the analog arithmetic operation circuit in FIG. 1 is applied;

FIG. 14 is a circuit diagram of a product-quotient calculating circuit to which the analog arithmetic operation circuit in FIG. 8 is applied; and FIG. 15 is a circuit diagram of a squared-value difference calculating circuit to which the analog arithmetic operation circuit in FIG. 8 is applied.

DETAILED DESCRIPTION OF THE PREFERRED EMBODIMENTS

Figure 4:
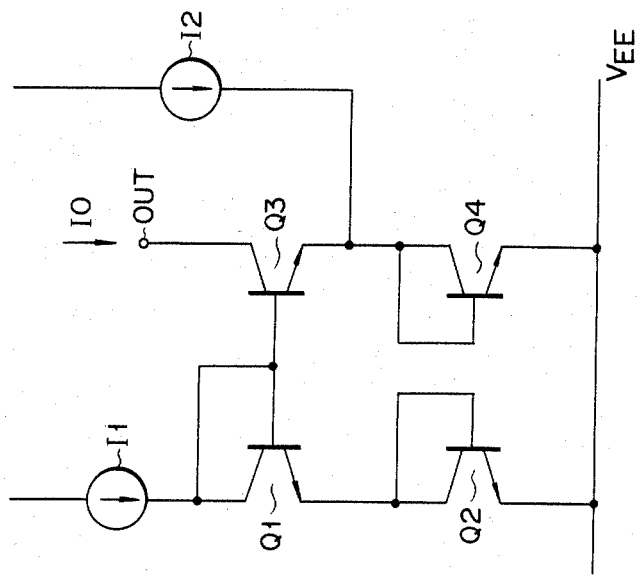
FIG. 4 is a circuit diagram of a conventional squaring circuit.

An analog arithmetic operation circuit according to a first embodiment of the present invention will be described with reference to FIG. 1. FIG. 1 is a circuit diagram of the fundamental analog arithmetic operation circuit according to the first embodiment. The fundamental circuit comprises: a first transistor Q1; a second transistor Q2, the base of which is connected to the emitter of the first transistor Q1 and the emitter of which is connected to a negative power source VEE; a third transistor Q3, the base of which is connected to the base of the first transistor Q1; a fourth transistor Q4, the collector and base of which are connected to the emitter of the third transistor Q3 and the emitter of which is connected to the negative power source VEE; a fifth transistor Q5, the base of which is connected to the base of the fourth transistor Q4, the collector of which is connected to a bias current source I2, and the emitter of which is connected to the negative power source VEE; and a sixth transistor Q6, the base of which is connected to a node between the bias current source I2 and the collector of the fifth transistor Q5 and the emitter of which is connected to the emitter of the third transistor Q3 and to the collector and base of the fourth transistor Q4.

A current mirror circuit 11 is comprised of the fourth and fifth transistor Q4 and Q5. The first and third transistors Q1 and Q3 are connected to an input current source or an output terminal in correspondence with the type of arithmetic operation. The collectors of the second and sixth transistors Q2 and Q6 are also connected in the predetermined manner. A collector current of the fourth transistor Q4 is set to the bias current I2 by a current mirror circuit 11. A more detailed analog arithmetic operation circuit will be described below.

FIG. 2 shows a squaring circuit to which the fundamental circuit in FIG. 1 is applied. The squaring circuit comprises transistors Q1 to Q6. The collector of the first transistor Q1 is connected to a positive power source VCC through the input current source I1 and the base and collector thereof are connected to each other. The collector and base of the second transistor Q2 is connected to the emitter of the first transistor Q1 and the emitter thereof is connected to the negative power source VEE. The collector of the third transistor Q3 is connected to an output terminal OUT for receiving an output current I0 and the base thereof is connected to the base of the first transistor Q1. The collector and base of the fourth transistor Q4 are connected to the emitter of the third transistor Q3 and the emitter thereof is connected to the negative power source VEE. The collector of the fifth transistor Q5 is connected to the positive power source VCC through the bias current source I2 and the base and emitter thereof are respectively connected to the base of the fourth transistor Q4 and the negative power source VEE. The fourth and fifth transistors Q4 and Q5 constitute the current mirror circuit 11. The collector of the sixth transistor Q6 is connected to the positive power source VCC, the base thereof is connected to a node between the input current source I2 and the collector of the fifth transistor, and the emitter thereof is connected to the emitter of the third transistor Q3 and to the collector and base of the fourth transistor Q4.

The output current I0 of the squaring circuit can be calculated as follows. Since the sum of base-to-emitter voltages VBE of the first and second transistors Q1 and Q2 is equal to the sum of base-to-emitter voltages VBE of the third and fourth transistors Q3 and Q4, the following equation is given:

$$VBE(Q1) + VBE(Q2) = VBE(Q3) + VBE(Q4) \quad (2)$$

Further, the following equation is established between the base-to-emitter voltage of the transistor operated in the active region and a collector current IC thereof:

$$VBE = VT \times \ln(IC/Is) \quad (3)$$

where VT is the thermal voltage, and Is is the reverse saturation current. If a common emitter current amplification factor $\beta$ of the first to fourth transistors Q1 to Q4 is sufficiently great, the base currents flowing through the bases thereof may be neglected. Meanwhile, since the fourth and fifth transistors Q4 and Q5 constitute the current mirror circuit 11, the collector currents thereof are always the same as the bias current I2. If equation (3) is substituted in equation (2), the following equation is obtained:

$$VT \cdot \ln(I1/Is) + VT \cdot \ln(I1/Is) = VT \cdot \ln(I0/Is) + VT \cdot \ln(I2/Is) \quad (4)$$

The output current I0 is thus obtained according to equation (4) as follows:

$$I0 = I1^2/I2 \quad (5)$$

The output current I0 given by equation (5) does not have an error term as may be apparent from a comparison of equations (1) and (5). Therefore, calculation precision of the output current I0 is further improved. Note that the sum of collector currents of the third and sixth transistors Q3 and Q6 is equal to the collector current (corresponding to the bias current I2) of the fourth transistor Q4, the collector current (corresponding to the output current I0) of the third transistor Q3 must be smaller than the bias current I2 as follows:

$$I0 \leq I2 \quad (6)$$

Figure 3:
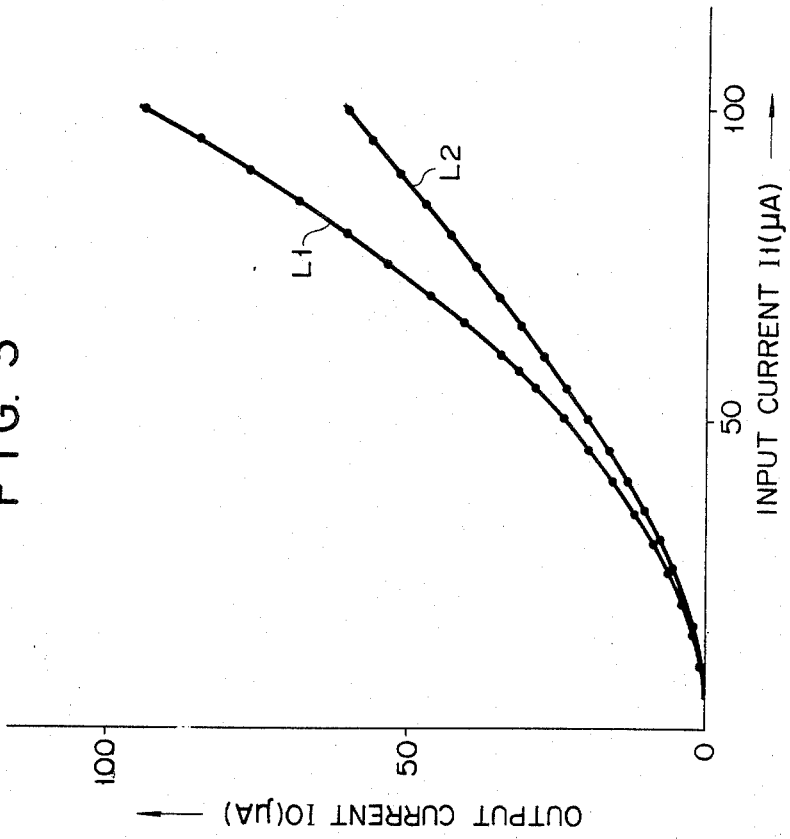
FIG. 3 is a graph for explaining an output current I0 as a function of an input current I1.

The input/output current characteristic curves of the squaring circuit according to the present invention and the conventional squaring circuit according to equation (1) are experimentally illustrated in FIG. 3. Note that the circuit diagram of the conventional squaring circuit is shown in FIG. 4. Referring to FIG. 3, a curve L1 is the input/output current characteristic curve of the squaring circuit according to the present invention, while a curve L2 is the input/output current characteristic curve of the conventional squaring circuit. The curves L1 and L2 indicate changes in the output currents I0 with changes in the input current I1 in a range of 0 to 100 $\mu$A, respectively, when a bias current (I2) of 100 $\mu$A is applied to the squaring circuits. Table 1 shows errors between calculated data and measured data.

TABLE 1.

| Input Current I1 $\mu$A | Output Current I0 (Calculated) $\mu$A | Prior Circuit (FIG. 3) | | Circuit of This Invention | |
|---|---|---|---|---|---|
| | | I0 $\mu$A | Error % | I0 $\mu$A | Error % |
| 10 | 1 | 0.921 | −7.9 | 0.934 | −6.6 |
| 20 | 4 | 3.61 | −9.8 | 3.76 | −6.0 |
| 30 | 9 | 7.84 | −12.9 | 8.50 | −5.6 |
| 40 | 16 | 13.3 | −16.9 | 15.1 | −5.6 |
| 50 | 25 | 19.6 | −22.0 | 23.6 | −5.6 |
| 60 | 36 | 26.7 | −25.8 | 34.0 | −5.6 |
| 70 | 49 | 34.3 | −30.0 | 46.2 | −5.7 |
| 80 | 64 | 42.3 | −33.9 | 60.2 | −5.9 |
| 90 | 81 | 50.6 | −37.5 | 75.9 | −6.3 |
| 100 | 100 | 59.2 | −40.8 | 93.2 | −6.8 |

As may be apparent from Table 1, in the conventional squaring circuit, when the input current I1 is gradually increased, errors in the output current I0 correspondingly increase. The maximum percentage of the error is −40%. However, in the squaring circuit according to the present invention, substantially the same error (about −6%) occurs in the input current range of 10 to 100 $\mu$A. Therefore, the squaring circuit according to the present invention provides highly precise arithmetic operations.

Figure 5:
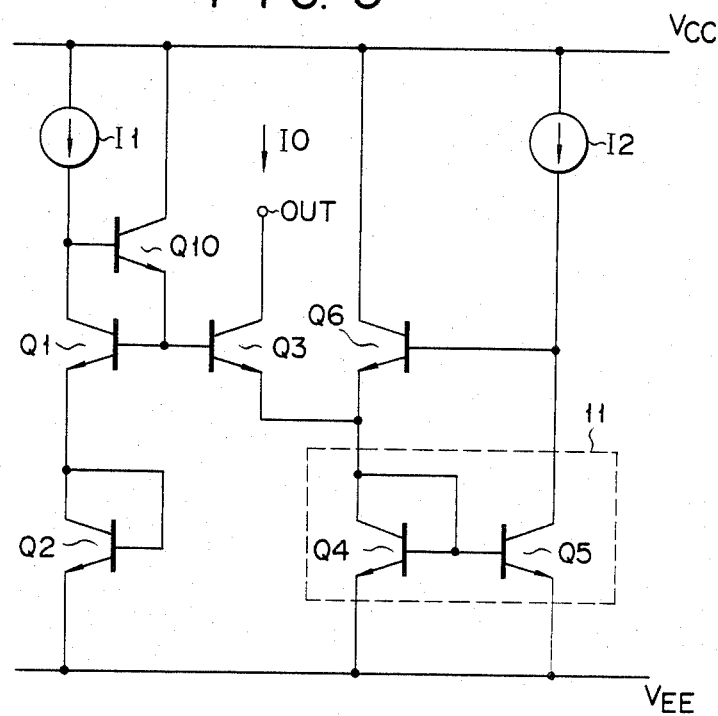
FIG. 5 is a circuit diagram of another squaring circuit to which the analog arithmetic operation circuit in FIG. 1 is applied.

FIG. 5 is a more improved squaring circuit according to the present invention. The amplification factor $\beta$ of the squaring circuit in FIG. 2 tends to decrease with a surge input current. The base currents of the first and third transistors Q1 and Q3 cause to give an error to the input current I1. As a result, an error of the output current I0 is increased. In order to solve the above problem, there is incorporated transistor Q10, the collector of which is connected to the positive power source VCC, the base of which is connected to the node between the input current source I1 and the collector of the first transistor Q1, and the emitter of which is connected to the bases of the first and third transistors Q1 and Q3, as shown in FIG. 5. The transistor Q10 functions to compensate for the base current.

Figure 6:
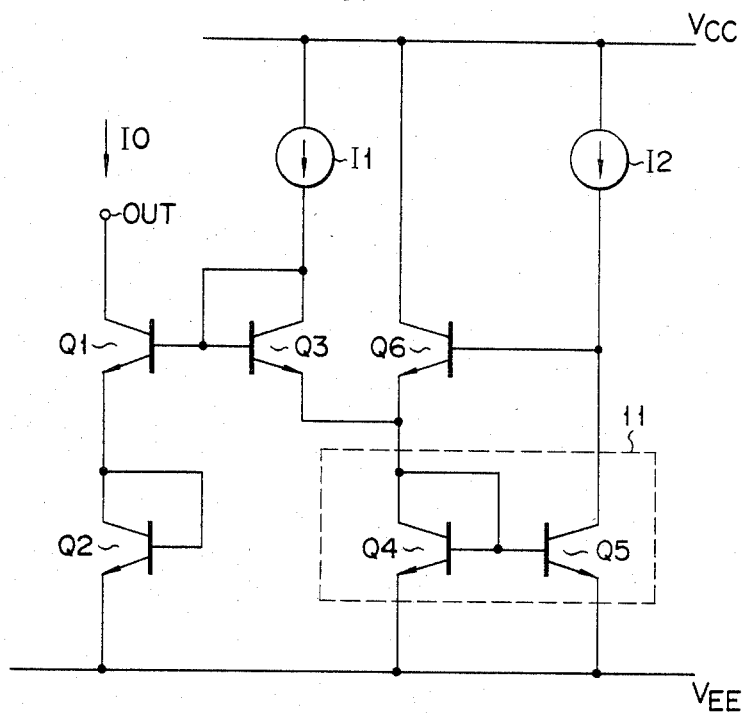
FIG. 6 is a circuit diagram of a square root calculating circuit to which the analog arithmetic operation circuit in FIG. 1 is applied.

Referring to FIG. 6, a square root calculating circuit according to the present invention will be described. The square root calculating circuit is the same as the squaring circuit in FIG. 2 except that the collector of the first transistor Q1 is connected to the output end OUT, and the collector of the third transistor Q3 is connected to the base thereof and to the positive power source VCC through the input current source I1. The same reference numerals used in FIG. 2 denote the same parts, and a detailed description thereof will be omitted. The output current I0 in this circuit is represented by a geometrical means between the input current I1 and the bias current I2 as follows:

$$I0 = \sqrt{I1 \times I2} \qquad (7)$$

provided that the currents I1, I2 and I0 satisfy relations I1<I2 and I0<I2.

Figure 7:
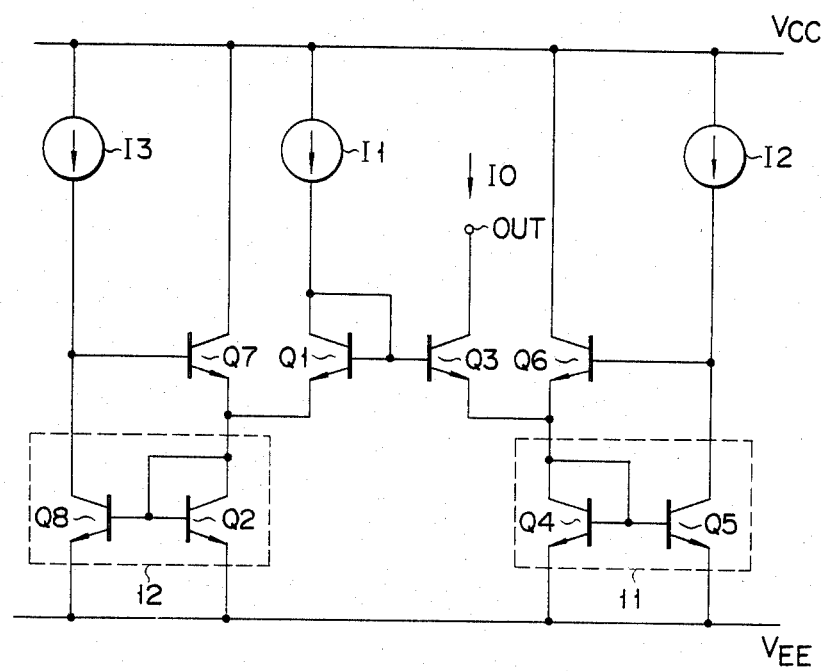
FIG. 7 is a circuit diagram of a product-quotient calculating circuit to which the analog arithmetic operation circuit in FIG. 1 is applied.

Referring to FIG. 7, a product-quotient calculating circuit according to the present invention will be described. The product-quotient calculating circuit is the same as the squaring circuit in FIG. 2 except that transistors Q7 and Q8 and an input current source I3 are added. The collector of the transistor Q7 is connected to the positive power source VCC, the base thereof is connected to the positive power source VCC through the input current source I3, and the emitter thereof is connected to the emitter of the first transistor Q1. The collector of the transistor Q8 is connected to the input current source I3 and to the base of the transistor Q7, the base thereof is connected to the base of the transistor Q2, and the emitter thereof is connected to the negative power source VEE. The transistors Q2 and Q8 constitute a current mirror circuit 12. A collector current of the second transistor Q2 is set to be equal to the input current I3 by the current mirror circuit 12. A collector current of the fourth transistor Q4 is set to be equal to the bias current I2 by the current mirror circuit 11. Therefore, the output current I0 in proportion to the product of the input currents I1 and I3 and to the quotient of the bias current I2 is produced at the output terminal OUT as follows:

$$I0 = (I1 \times I3)/I2 \qquad (8)$$

provided that the currents I0, I1, I2 and I3 satisfy relations I0<I2 and I1<I3.

The circuits in FIGS. 6 and 7 can also provide highly precise arithmetic operations.

Figure 8:
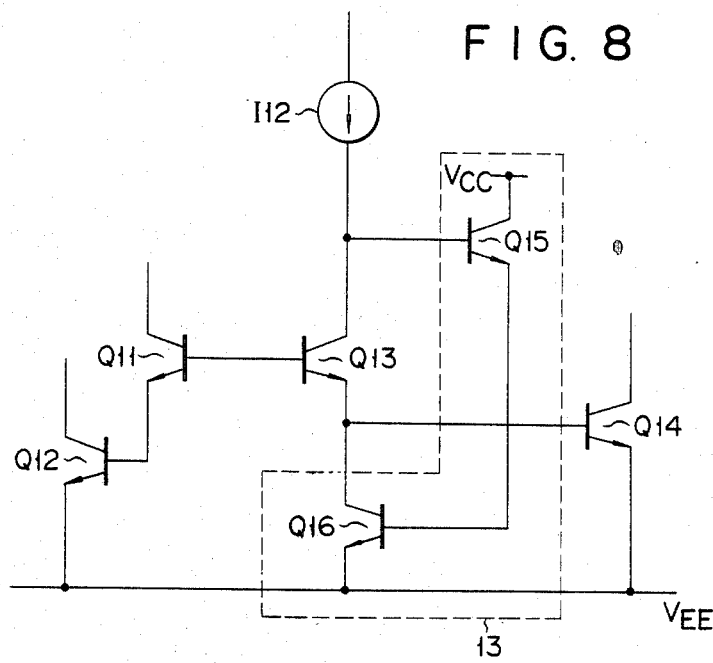
FIG. 8 is a circuit diagram of a fundamental analog arithmetic operation circuit according to a second embodiment of the present invention.

A fundamental analog arithmetic operation circuit according to a second embodiment of the present invention will be described with reference to FIG. 8. The analog arithmetic operation circuit has six transistors Q11 to Q16. The emitter of the transistor Q11 is connected to the base of the transistor Q12, and the base thereof is connected to the base of the transistor Q13. The emitter of the transistor Q12 is connected to the negative power source VEE. The collector of the transistor Q13 is connected to a bias current source I12 and to the base of the transistor Q15. The emitter of the transistor Q13 is connected to the base of the transistor Q14 and to the collector of the transistor Q16. The emitter of the transistor Q14 is connected to the negative power source VEE. The collector of the transistor Q15 is connected to the positive power source VCC, and the emitter thereof is connected to the base of the transistor Q16. The emitter of the transistor Q16 is connected to the negative power source VEE. The transistors Q15 and Q16 constitute a feedback circuit 13. The collectors of the transistors Q11 to Q14 are connected to a predetermined power source or an output terminal in correspondence with the type of arithmetic calculation.

The fundamental analog arithmetic operation circuit according to the second embodiment of the present invention causes the feedback circuit 13 to set the collector current of the transistor Q13 at a predetermined value. More detailed operation circuits to which the fundamental circuit is applied are described below.

A squaring circuit will be described with reference to FIG. 9. The squaring circuit comprises seven transistors Q11 to Q17. The collector of the transistor Q11 is connected to the positive power source VCC through an input current source I11, the emitter thereof is connected to the collector of the transistor Q12, and the base thereof is connected to the base of the transistor Q13 and to the collector thereof. The emitter of the transistor Q12 is connected to the negative power source VEE, and the base thereof is connected to the collector thereof. The collector of the transistor Q13 is connected to the positive power source VCC through a bias current source I12 and to the base of the transistor Q15, and the emitter thereof is connected to the base of the transistor Q14 and to the collector of the transistor Q16. The collector of the transistor Q14 is connected to the output terminal OUT, and the emitter thereof is connected to the negative power source VEE. The collector of the transistor Q15 is connected to the positive power source VCC, and the emitter thereof is connected to the bases of the transistors Q16 and Q17 and to the collector of the transistor Q17. The emitters of the transistors Q16 and Q17 are connected to the negative power source VEE. The transistors Q16 and Q17 constitute a current mirror circuit 14. The transistor Q15 and the current mirror circuit 14 constitute the feedback circuit 13.

The output current I0 of the above circuit can be calculated as follows. Since the sum of the base-to-emitter voltages VBE of the transistors Q11 and Q12 is the same as that of the base-to-emitter voltages VBE of the transistors Q13 and Q14, the following equation is given:

$$VBE(Q11) + VBE(Q12) = VBE(Q13) + VBE(Q14) \qquad (9)$$

The feedback circuit 13 allows the collector current of the transistor Q13 to be constantly the same as the bias current I1 to be described below. Since the same collector current I11 flows through the transistors Q11 and Q12, the base voltage of the transistor Q13 is set at 2VBE. The collector voltage of the transistor Q16 is set to VBE which is lower than the base voltage (2VBE) of the transistor 13 by the base-to-emitter voltage VBE.

The collector voltage of the transistor Q17 is also set at VBE. The base voltage of the transistor Q15 is set at 2VBE which is higher than the collector voltage of the transistor Q17 by the base-to-emitter voltage VBE of the transistor Q15. However, if the base currents flowing through the transistors Q13 to Q17 are substantially negligible, the collector currents IC(Q13), IC(Q15), IC(Q16) and IC(Q17) of the transistors Q13, Q15, Q16, and Q17 are substantially the same.

The following equation is given for the relationship between the input current source I12 and the two transistors Q13 and 15:

$$I12 = IC(Q13) + 1/\beta \cdot IC(Q15) \qquad (10)$$

where $\beta$ is the common emitter current amplification factor of the transistor Q15. $1/\beta \cdot IC(Q15)$ in equation (10) corresponds to the base current of the transistor Q15 and is substantially negligible. Therefore, equation (10) is expressed as follows:

$$I12 = IC(Q13) \qquad (11)$$

If the bias current I12 is increased, the base, collector and emitter currents of the transistor Q15, the collector current of the transistor Q17, the collector current of the transistor Q16 and the emitter current of the transistor Q13 are increased in the order named, and the collector current of the transistor Q13 is finally increased. However, if the bias current I12 is decreased, the currents are decreased in the same order, and the collector current of the transistor Q13 is finally decreased. Therefore, the collector current IC(Q13) of the transistor Q13 is substantially the same as the bias current I12.

If equation (3) is substituted in equation (9), the following equation is obtained:

$$\begin{aligned}&VT \cdot \ln(I11/Is) + VT \cdot \ln(I11/Is) \\ &= VT \cdot \ln(I12/Is) + VT \cdot \ln(I0/Is)\end{aligned} \qquad (12)$$

Therefore, $$I0 = I11^2/I12 \qquad (13)$$

Since the left-hand term representing the output current I0 does not have a corresponding error term, highly precise arithmetic operation can be performed. Further, the squaring circuit described above has another advantage in that there are no restrictive requirements for the output current I0.

Figure 9:
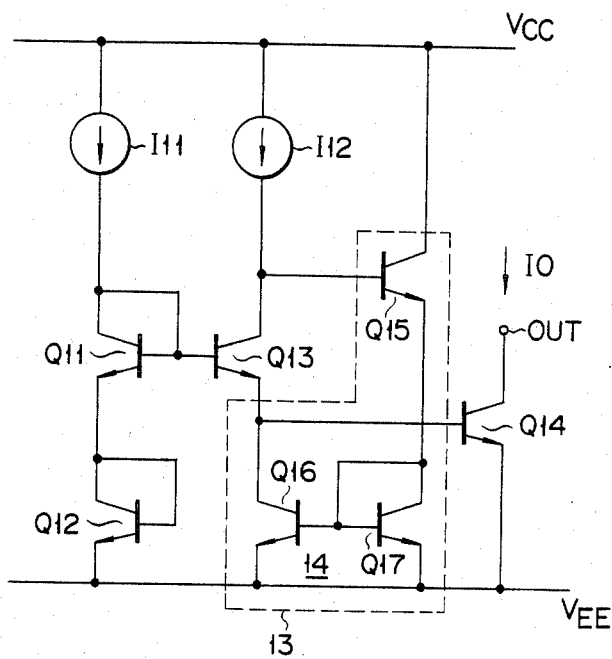
FIG. 9 is a circuit diagram of a squaring circuit to which the analog arithmetic operation circuit in FIG. 8 is applied.
Figure 10:
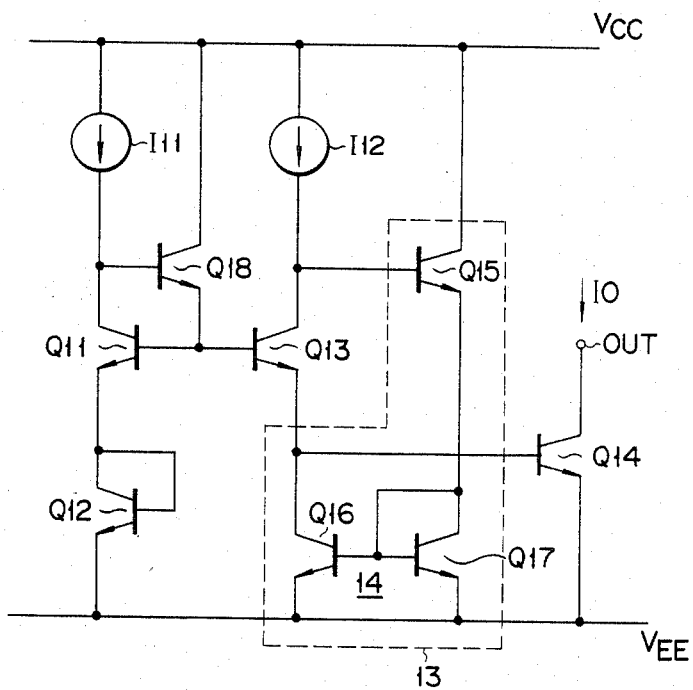
FIG. 10 is a circuit diagram of another squaring circuit to which the analog arithmetic operation circuit in FIG. 8 is applied.

FIG. 10 is a further improved squaring circuit over the first embodiment (FIG. 2) according to the present invention. The amplification factor $\beta$ of the squaring circuit in FIG. 9 according to the present invention tends to be lowered with a surge input current. The base currents of the transistors Q11 and Q13 cause a change in the input current I11. As a result, an error in the output current I0 is correspondingly increased. In order to solve the above problem, as shown in FIG. 10, there is incorporated a transistor Q18, the collector of which is connected to the positive power source VCC, the base of which is connected to the collector of the transistor Q11, and the emitter of which is connected to the bases of the transistors Q11 and Q13. The transistor Q18 functions to compensate for the base current.

In the circuits of FIGS. 9 and 10, the transistor Q17 which constitutes the current mirror circuit 14 of the feedback circuit 13 may be omitted. In this case, the emitter current of the transistor Q13 changes with a $\beta$ multiple of changes in the base current of the transistor Q15 through the two transistors Q15 and Q16. Therefore, if the common emitter current amplification factor $\beta$ is great, circuit operation becomes unstable.

A square root calculating circuit to which the fundamental circuit of the second embodiment is applied according to the present invention will be described with reference to FIG. 11. The square root calculating circuit is the same as the circuit in FIG. 9 except that the collector of the transistor Q11 is connected to the output terminal OUT and that the collector of the transistor Q14 is connected to the positive power source VCC through the input current source I11 and to the bases of the transistors Q11 and Q13. The same reference numerals used in FIG. 9 denote the same parts in FIG. 11, and a detailed description thereof will be omitted.

In the square root calculating circuit shown in FIG. 11, the output current I0 is expressed by a geometrical means between the imput current I11 and the bias current I12 as follows:

$$I0 = \sqrt{I11 \times I12} \qquad (14)$$

Figure 11:
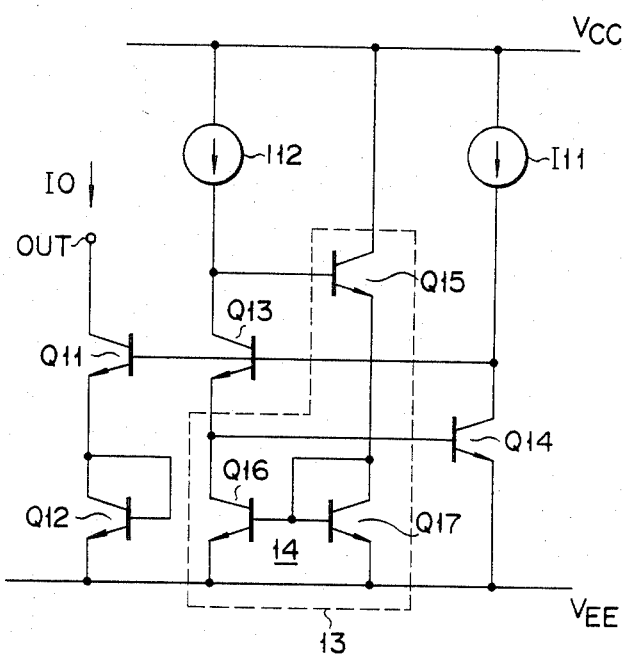
FIG. 11 is a circuit diagram of a square root calculating circuit to which the analog arithmetic operation circuit in FIG. 8 is applied.
Figure 12:
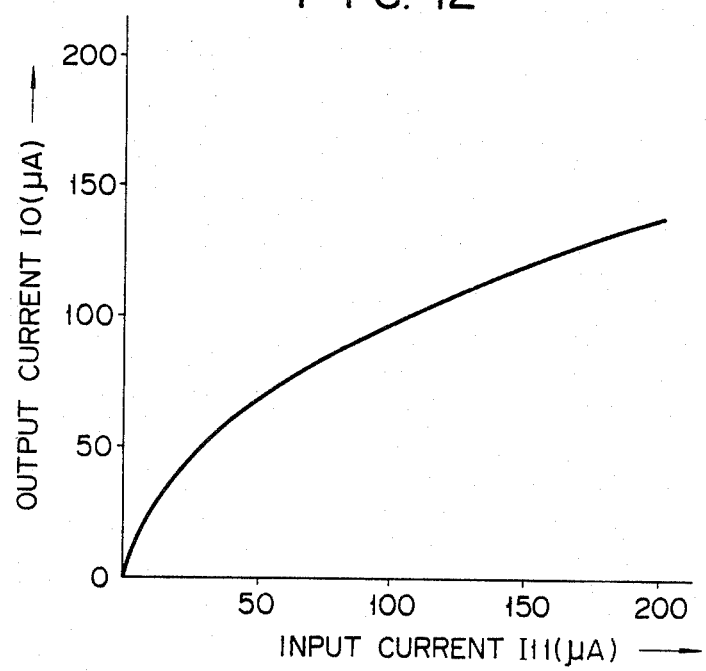
FIG. 12 is a graph for explaining an output current I0 as a function of an input current I11.

The calculated values of the square root calculating circuit in FIG. 11 are compared with the measured values in Table 2. Table 2 shows measured values of the output current I0 as a function of the input current I11 which varies in a range of 0 to 1,000 μA when the bias current I12 is set to be 100 μA, calculated values and errors of the output current I0. FIG. 12 shows measured values of the output current I0 as a function of the input current I11, while FIG. 13 shows errors of the output current I0 as a function of the input current I11.

Figure 13:
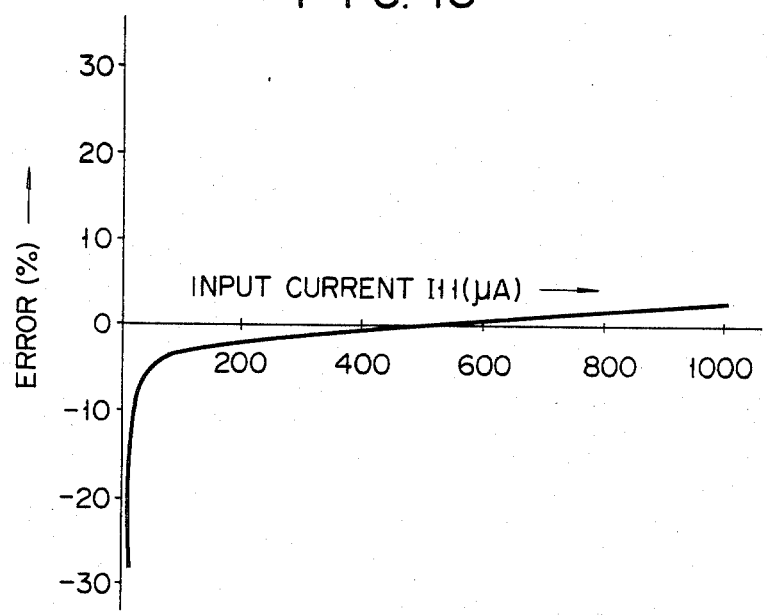
FIG. 13 is a graph for explaining an error as a function of the input current I11 in the square root calculating circuit in FIG. 11.

As may be apparent from Table 2 and FIG. 13, the error of the output current I0 with the input current I11 in the range of 100 to 1,000 μA is ±3%. Thus, a highly reliable square root calculating circuit is obtained.

TABLE 2

| Input Current I11 (μA) | Output Current I0 (μA) | | Error (%) |
|---|---|---|---|
| | Measured | Calculated | |
| 5 | 16.2 | 22.4 | −27.7 |
| 10 | 27.1 | 31.6 | −14.2 |
| 20 | 41.1 | 44.7 | −8.1 |
| 40 | 60.1 | 63.2 | −4.9 |
| 60 | 74.4 | 77.5 | −4.0 |
| 80 | 86.4 | 89.4 | −3.4 |
| 100 | 97.0 | 100.0 | −3.0 |
| 120 | 106.5 | 109.5 | −2.7 |
| 140 | 115.3 | 118.3 | −2.5 |
| 160 | 123.5 | 126.5 | −2.4 |
| 180 | 131.2 | 134.2 | −2.2 |
| 200 | 138.5 | 141.4 | −2.1 |
| 300 | 170.7 | 173.2 | −1.4 |
| 400 | 198.3 | 200.0 | −0.9 |
| 500 | 223.1 | 223.6 | −0.2 |
| 600 | 245.8 | 244.9 | 0.4 |
| 700 | 267.1 | 264.6 | 0.9 |
| 800 | 287.2 | 282.8 | 1.6 |
| 900 | 306.5 | 300.0 | 2.2 |
| 1000 | 325.0 | 316.2 | 2.8 |

A product-quotient calculating circuit to which the fundamental circuit in FIG. 9 of the second embodiment is applied will be described with reference to FIG. 14. The collector of the transistor Q11 is connected to the positive power source VCC through the input current source I11. The collector of the transistor Q12 is connected to the bases of the transistors Q11 and Q13 and to the positive power source VCC through an input current source I13. The collector of the transistor Q13 is connected to the positive power source VCC through the input current source I12. Further, a feedback circuit 23 comprising three transistors Q19 to Q21 is arranged on the side of the transistor Q11. The feedback current 23 allows the collector current of the transistor Q11 to be constantly the same as the input current I11.

In the feedback circuit 23, the collector of the transistor Q19 is connected to the positive power source VCC, and the base thereof is connected to the collector of the transistor Q11. The base of the transistor Q20 is connected to the emitter of the transistor Q19, the collector thereof is connected to the emitter of the transistor Q11, and the emitter thereof is connected to the negative power source VEE. The collector of the transistor Q21 is connected to the base thereof and to the emitter of the transistor Q19, and the emitter thereof is connected to the negative power source VEE. The transistors Q20 and Q21 constitute a current mirror circuit 24. Other parts of the arrangement of the circuit are the same as those of the circuit in FIG. 9. The same reference numerals used in FIG. 9 denote the same parts in FIG. 14, and a detailed description thereof will be omitted. In the circuit in FIG. 14, the transistors Q17 and Q21 may be omitted. The output current I0 in proportion to the product of the input currents I11 and I13 and in inverse proportion to the input current I12 is produced at the output terminal OUT as follows:

$$I0 = (I11 \times I13)/I12 \tag{15}$$

A squared-value difference calculating circuit according to the present invention will be described with reference to FIG. 15. The collector of the transistor Q11 is connected to the positive power source VCC through the input current source I11. The collector of a transistor Q22 is connected to the base thereof and to the positive power source VCC through the input current source I13, and the emitter thereof is connected to the emitter of the transistor Q11. The base of a transistor Q23 is connected to the base of the transistor Q22, the collector thereof is connected to the collector of the transistor Q11, and the emitter thereof is connected to the emitter of the transistor Q11. The transistors Q22 and Q23 constitute a current mirror circuit 34. Other parts of the arrangement of the squared-value difference calculating circuit are the same as those of the circuit in FIG. 9. The same reference numerals used in FIG. 9 denote the same parts as in FIG. 15, and a detailed description thereof will be omitted.

In the squared-value difference calculating circuit, the collector current of the transistor Q11 corresponds to a current difference I11 −I13, while the collector current of the transistor Q12 corresponds to a current sum I11 +I13. If equation (3) and the above current values are substituted in equation (9), equation (16) is obtained as follows:

$$\begin{aligned}VT \cdot \ln(I11-I13)/Is + VT \cdot \ln(I11+I13)/Is \\ = VT \cdot \ln(I12/Is) + VT \cdot \ln(I0/Is)\end{aligned} \tag{16}$$

Therefore, the output current I0 can be obtained by the following equation:

$$I0 = (I11^2 - I13^2)/I12 \tag{17}$$

The output current I0 is proportional to a difference of squared values of the input currents I11 and I13. Therefore, the circuits in FIGS. 14 and 15 can provide highly precise arithmetic operations.

In the above embodiments, npn transistors are used. However, pnp transistors may also be used. In this case, the polarities of the power sources must be reversed.

What is claimed is:

1. An analog arithmetic operation circuit having a first and second power source, said circuit comprising:
   a first transistor having a collector and a base coupled together;
   a first input current source connected between said first power source and the collector-base connection of said first transistor;
   a second input current source;
   an output terminal;
   a second transistor having a collector and a base connected to an emitter of said first transistor, the emitter of said second transistor being connected to said second power source;
   a third transistor having a collector connected to said output terminal, the base of said third transistor being connected to the base of said first transistor;
   a fourth transistor having a collector and a base connected to an emitter of said third transistor, the emitter of said fourth transistor being connected to said second power source;
   a fifth transistor having a collector connected to said second input current source, said second input current source being connected between said collector of said fifth transistor and said first power source, the base of said fifth transistor being connected to the base of said fourth transistor, and the emitter of said fifth transistor being connected to said second power source, whereby said fifth transistor together with said fourth transistor constitute a current mirror circuit; and
   a sixth transistor having a collector connected to said first power source, a base connected to the collector of said fifth transistor, and an emitter connected to the collector of said fourth transistor, whereby an output current in proportion to a squared value of current values of said first input current source is produced at said output terminal.

2. The circuit in claim 1 further comprising a seventh transistor for compensating for the base current of said first transistor, said seventh transistor having a collector connected to said first power source and a base connected to the collector of said first transistor and an emitter connected to the base of said first transistor.

3. An analog arithmetic operation circuit having a first and a second power source, said circuit comprising:
   an output terminal;
   a first transistor having a collector connected to said output terminal, said first transistor having a base and emitter;
   a second transistor having a collector and a base connected to the emitter of said first transistor, the emitter of said second transistor being connected to the second power source;
   a third transistor having a collector and a base coupled together, and a base connected to the base of said first transistor, said third transistor having an emitter;
   a first input current source connected between said first power source and the collector base connection of said third transistor;

a fourth transistor having a collector and a base connected to the emitter of said third transistor, the emitter of said fourth transistor being connected to said second power source;

a second input current source;

a fifth transistor having a collector connected to said second input current source, said second input current source being connected between the collector of said fifth transistor and said first power source, a base connected to the base of said fourth transistor, and an emitter connected to said second power source, said fifth transistor together with said fourth transistor constituting a current mirror circuit; and a sixth transistor having a collector connected to said first power source, a base connected to said second input current source and the collector of said fifth transistor, and an emitter connected to the collector of said fourth transistor whereby the output current corresponding to a square root of a product of current values of said first and second input current sources is produced at said output terminal.

4. An analog arithmetic operation circuit having a first and a second power source, said circuit comprising:

a first input current source;
a second input current source;
a third input current source;
an output terminal;

a first transistor having a collector and a base connected to said first input current source, said first input current source being connected between said first power source and the collector base connection of said first transistor, said first transistor having an emitter;

a second transistor having a collector and a base connected to the emitter of said first transistor, the emitter of said second transistor being connected to the second power source;

a third transistor having a collector connected to said output terminal, a base connected to the base of said first transistor and said first input, said third transistor having an emitter;

a fourth transistor having a collector and base connected to the emitter of said third transistor, the emitter of said fourth transistor being connected to said second power source;

a fifth transistor having a collector connected to said second input current source, said second input current source being connected between said first power source and the collector of said fifth transistor, a base connected to the base of said fourth transistor, and an emitter connected to said second power source, said fifth transistor together with said fourth transistor constituting a current mirror circuit;

a sixth transistor having a collector connected to the first power source, a base connected to the collector of said fifth transistor, and an emitter connected to the collector of said fourth transistor;

a seventh transistor having a collector connected to the first power source, a base connected to said third input current source, said third input current source being connected between said first power source and the base of said seventh transistor, and an emitter connected to the collector of said second transistor;

an eighth transistor having a collector connected to said third input current source, a base connected to the base of said second transistor and an emitter connected to said second power source, said eighth transistor together with said second transistor constituting a current mirror circuit, whereby the output current in proportion to the product of currents of said first and third input current sources and in inverse proportion to a current of said second input current source is produced at said output terminal.

5. An analog arithmetic operation circuit having a first and a second power source, said circuit comprising:

a first input current source;
a second input current source;
an output terminal;

a first transistor having a collector and a base coupled to said first input current source, said first input current source being connected between said first power source and the collector base connections of said first transistor, said first transistor having an emitter;

a second transistor having a collector and a base connected to the emitter of said first transistor, the emitter of said second transistor being connected to the second power source;

a third transistor having a collector connected to said second input current source, said second input current source being connected between said first power source and the collector of said third transistor, a base connected to the base of said first transistor, said third transistor having an emitter;

a fourth transistor having a collector connected to said output terminal, a base connected to the emitter of said third transistor, and an emitter connected to said second power source;

a fifth transistor having a collector connected to the first power source, a base connected to said second input current source and the collector of said third transistor, said fifth transistor having an emitter;

a sixth transistor having a collector connected to the emitter of said third transistor, an emitter connected to said first power source, said sixth transistor having a base; and a seventh transistor having a collector connected to the emitter of said fifth transistor, a base connected to the base of said sixth transistor and the emitter of said fifth transistor, and an emitter connected to said second power source, said seventh transistor together with said sixth transistor constituting a current mirror circuit, whereby the output current in proportion to a squared value of a current value of said first input current source is produced at said output terminal.

6. The circuit in claim 5, further comprising an eighth transistor for compensating for the base current of said first transistor, said eighth transistor having a collector connected to said first power source, a base connected to the collector of said first transistor, and an emitter connected to the base of said first transistor.

7. An analog arithmetic operation circuit having a first and a second power source, said circuit comprising:

a first input current source;
a second input current source;
an output terminal;

a first transistor having a collector connected to said output terminal, said first transistor having a base and an emitter;

a second transistor having a collector and base connected to the emitter of said first transistor, the emitter of said second transistor being connected to the second power source;

a third transistor having a collector connected to said second input current source, said second input current source being connected between said first power source and the collector of said third transistor, and a base connected to the base of said first transistor, said third transistor having an emitter;

a fourth transistor having a collector connected to said first input current source and the base of said third transistor, said first input current source being connected between said first power source and the collector of said fourth transistor, a base connected to the emitter of said third transistor, and an emitter connected to said second power source;

a fifth transistor having a collector connected to the first power source, a base connected to the collector of said third transistor, said fifth transistor having an emitter;

a sixth transistor having a collector connected to the emitter of said third transistor, and an emitter connected to said second power source said sixth transistor having a base; and a seventh transistor having a collector connected to the emitter of said fifth transistor, a base connected to the base of said sixth transistor and the emitter of said fifth transistor, and an emitter connected to said second power source, said seventh transistor together with said sixth transistor constituting a current mirror circuit, whereby the output current which is equal to the square root of the product of current values of said first and second input current sources is produced at said output terminal.

8. An analog arithmetic operation circuit having a first and a second power source, said circuit comprising:

a first input current source;
a second input current source;
a third input current source;
an output terminal;

a first transistor having a collector connected to said first input current source, said first input current source being connected between said first power source and the collector of said first transistor, said first transistor having an emitter and a base;

a second transistor having a collector connected to said third input current source and the base of said first transistor, a base connected to the emitter of said first transistor, an emitter connected to the second power source, said third input current source being connected between said first power source and the collector of said second transistor;

a third transistor having a collector connected to said second input current source, a base connected to the base of said first transistor, said second input current source being connected between said first power source and the collector of said third transistor, said third transistor having an emitter;

a fourth transistor having a collector connected to said output terminal, a base connected to the emitter of said third transistor, and an emitter connected to said second power source;

a fifth transistor having a collector connected to the first power source, a base connected to the collector of said third transistor, said fifth transistor having an emitter;

a sixth transistor having a collector connected to the emitter of said third transistor, and an emitter connected to said second power source, said sixth transistor having a base;

a seventh transistor having a collector connected to the emitter of said fifth transistor, a base connected to the base of said sixth transistor and the emitter of said fifth transistor, and an emitter connected to said second power source, said seventh transistor together with said sixth transistor constituting a current mirror circuit;

a ninth transistor having a collector connected to said first power source, a base connected to the collector of said first transistor, said ninth transistor having an emitter;

a tenth transistor having a collector connected to the emitter of said first transistor, and an emitter connected to said first power source, said tenth transistor having a base; and an eleventh transistor having a collector connected to the emitter of said ninth transistor, a base connected to the base of said tenth transistor and the emitter of said ninth transistor, and an emitter connected to said first power source, said eleventh transistor together with said tenth transistor constituting a current mirror ciruit, whereby the output current in proportion to the product of current values of said first and third input current sources and in inverse proportion to the current value of said second input current source is produced at said output terminal.

9. An analog arithmetic operation circuit having a first and a second power source, said circuit comprising:

a first input current source;
a second input current source;
a third input current source;
an output terminal;

a first transistor having a collector and a base connected to said first input current source, said first imput current source being connected between said first power source and the collector base connection of said first transistor, said first transistor having an emitter;

a second transistor having a collector and a base connected to the emitter of said first transistor, an emitter connected to the second power source;

a third transistor having a collector connected to said second input current source, said second input current source being connected between the said first power source and the collector of said third transistor, a base connected to the base of said first transistor, said third transistor having an emitter;

a fourth transistor having a collector connected to said output terminal, a base connected to the emitter of said third transistor, and an emitter connected to said second power source;

a fifth transistor having a collector connected to the first power source, a base connected to the collector of said third transistor, said fifth transistor having an emitter;

a sixth transistor having a collector connected to the emitter of said third transistor, and an emitter connected to said second power source, said sixth transistor having a base;

a seventh transistor having a collector connected to the emitter of said fifth transistor, a base connected to the base of said sixth transistor and the emitter of said fifth transistor, and an emitter connected to said second power source, said seventh transistor together with said sixth transistor constituting a current mirror circuit;

an eighth transistor having a collector and a base connected to said third input current source, said third input current source being connected between said first power source and the collector base connection of said eighth transistor, and an emitter connected to the emitter of said first transistor; and a ninth transistor having a collector connected to the collector of said first transistor, a base connected to the base of said eighth transistor and an emitter connected to the emitter of said first transistor, said ninth transistor together with said eighth transistor constituting a current mirror ciruit, whereby the output current in proportion to a difference of squared current values of said first and third input current sources is produced at said output terminal.

* * * * *